United States Patent
Jiang et al.

(10) Patent No.: US 8,541,308 B2
(45) Date of Patent: Sep. 24, 2013

(54) POLISHING METHOD AND METHOD FOR FORMING A GATE

(75) Inventors: Li Jiang, Shanghai (CN); Mingqi Li, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 139 days.

(21) Appl. No.: 13/244,196

(22) Filed: Sep. 23, 2011

(65) Prior Publication Data

US 2012/0270343 A1    Oct. 25, 2012

(30) Foreign Application Priority Data

Apr. 20, 2011    (CN) .......................... 2011 1 0099722

(51) Int. Cl.
*H01L 21/461*    (2006.01)
*H01L 21/302*    (2006.01)

(52) U.S. Cl.
USPC ........................... 438/690; 438/693; 438/595

(58) Field of Classification Search
USPC .......................... 438/690, 693, 595
See application file for complete search history.

(56) References Cited

U.S. PATENT DOCUMENTS

| | | | |
|---|---|---|---|
| 6,238,450 B1 * | 5/2001 | Garg et al. ...................... | 51/309 |
| 2002/0039874 A1 * | 4/2002 | Hecker et al. ................... | 451/7 |
| 2002/0049027 A1 | 4/2002 | Walker et al. | |
| 2004/0132305 A1 * | 7/2004 | Nishimoto et al. ........... | 438/690 |
| 2005/0287931 A1 * | 12/2005 | Saegusa et al. ................ | 451/41 |
| 2006/0141790 A1 * | 6/2006 | Kim et al. ...................... | 438/691 |
| 2009/0047870 A1 * | 2/2009 | Siddiqui et al. ................ | 451/36 |
| 2009/0130849 A1 * | 5/2009 | Lee ................................ | 438/693 |

* cited by examiner

*Primary Examiner* — Luan C Thai
(74) *Attorney, Agent, or Firm* — Anova Law Group, PLLC

(57) ABSTRACT

A polishing method and a method for forming a gate are provided. The method includes forming a dummy gate on a semiconductor substrate including a sacrificial oxide layer and a polysilicon layer which covers the sacrificial oxide layer, forming spacers around the dummy gate, and successively forming a silicon nitride layer and a dielectric layer covering the silicon nitride layer. The method further includes polishing the dielectric layer until the silicon nitride layer is exposed, polishing the silicon nitride layer on a fixed abrasive pad until the polysilicon layer is exposed by using a polishing slurry with a PH value ranging from 10.5 to 11 and comprising an anionic surfactant or a zwitterionic surfactant. Additionally, the method includes forming an opening after removing the dummy gate, and forming a gate in the opening. The method eliminates potential erosion and dishing caused in the polishing of the silicon nitride layer.

11 Claims, 7 Drawing Sheets

PH=10.8

PH=11

POLISHING METHOD AND METHOD FOR FORMING A GATE

CROSS-REFERENCES TO RELATED APPLICATIONS

The present application claims the priority of Chinese Patent Application No. 201110099722.3, entitled "Polishing method and method for forming a gate", and filed on Apr. 20, 2011, the entire disclosure of which is incorporated herein by reference.

FIELD OF THE INVENTION

The present invention is generally related to semiconductor manufacturing field, and more particularly, to a polishing method and a method for forming a gate.

BACKGROUND OF THE INVENTION

In semiconductor manufacturing process, a flat wafer surface is very important for semiconductor devices towards high compactness and density. The conventional method for planarizing wafer surface is a chemical mechanical polishing method. In this method, a polishing slurry is added between a wafer surface and a polishing pad, and mechanical forces and chemical reactions between the polishing slurry and the wafer surface are taken advantage of to planarize the wafer surface. The conventional chemical mechanical polishing method is a dissociation abrasive polishing method. In the dissociation abrasive polishing method, an abrasive in a polishing slurry is distributed randomly on a polishing pad, which induces many problems such as an uneven density, a poor polishing result, a low utilization ratio of the polishing slurry and environmental pollution caused by the dumped polishing slurry. Therefore, the dissociation abrasive polishing method is gradually replaced by a fixed abrasive polishing method.

In the fixed abrasive polishing method, an abrasive and a polishing pad are combined together to form a fixed abrasive pad with a regular concave-convex surface. Referring to FIG. 1, a conventional fixed abrasive polishing method, as known in the prior art, includes conveying a polishing pad 102 to a polishing platen 101 by an input roller 105a and an output roller 105b, wetting the surface of the polishing pad 102 by a polishing slurry, and mounting a wafer 103 to a polishing chuck 104 so that the wafer surface contacts the abrasive layer of the polishing pad 102. The method further includes starting a driving power to rotate the polishing platen 101 by rotary driving of a bearing 100 and to rotate the wafer 103 by rotary driving of a polishing head 104, which make the polishing platen 101 and the wafer 103 rotate in opposite directions so that the surface of the wafer 103 is polished by the abrasive layer of the polishing pad 102. In this polishing process, a contact area between the polishing pad and the wafer is smaller than that in the conventional dissociation abrasive polishing method because only abrasive blocks of the polishing pad 102 contacts the surface of the wafer 103, so that there is a greater pressure force in the contact area. Accordingly, to a large extent, the polishing speed and efficiency are improved and the process window of erosion is broadened, which reduces the erosion and dishing problems greatly and enhances the product yield. Moreover, because the polishing speed has a high selectivity to the surface topography of the wafer, a desired polishing effect can be achieved by a less removal, which further reduces the production cost. With the continuous development of semiconductor manufacturing technology, and the continuous scaling down of the critical dimensions of semiconductor devices, the fixed abrasive polishing method has become more and more important.

To solve problems caused by devices with small critical dimensions, a technology combining a high-k gate dielectric layer and a metal gate is introduced into the manufacturing process of MOS transistors.

Referring to FIG. 2 to FIG. 6, which are schematic cross-sectional views illustrating a method for forming a high-k dielectric metal gate, as known in the prior art. the method includes:

Step S1, referring to FIG. 2: forming a dummy gate structure on a semiconductor substrate (not shown in the drawing), wherein the dummy gate structure includes a sacrificial oxide layer 201 and a polysilicon layer 202 covering the sacrificial oxide layer 201; forming spacers 203 around the dummy gate structure, wherein the spacers 203 may include silicon dioxide; and forming a silicon nitride layer 204 and a dielectric layer 205 covering the silicon nitride layer in sequence, wherein the dielectric layer 205 may include silicon dioxide and the silicon nitride layer 204 covers the polysilicon layer 202, the spacers 203 and the substrate;

Step S2, referring to FIG. 3, polishing the dielectric layer 205 until the silicon nitride layer 204 is exposed;

Step S3, referring to FIG. 4, polishing the silicon nitride layer 204 and the dielectric layer 205 until the polysilicon layer 202 is exposed;

Step S4, referring to FIG. 5, forming an opening 206 after etching and removing the dummy gate structure (the sacrificial oxide layer 201 and the polysilicon layer 202); and Step S5, referring to FIG. 6, forming a gate dielectric layer 200 and a metal gate 207 successively in the opening 206, wherein the gate dielectric layer 200 may include high-k materials and the metal gate 207 may include aluminum or ruthenium.

The polishing processes described in the step S2 and step S3 are conducted continuously. Because the conventional dissociation abrasive polishing method can't achieve a desired surface flatness and uniformity, the fixed abrasive polishing method is generally applied to polishing processes nowadays. However, although the fixed abrasive polishing method can achieve a high flatness in the step S2, it induces obvious dishing and erosion problems in the step S3. As shown in FIG. 10, the polishing result is poor because of an erosion opening 208 and a dishing opening 209.

More related technologies are disclosed in US Patent No. 20020049027. But solutions on how to solve the problems mentioned above are not disclosed.

BRIEF SUMMARY OF THE INVENTION

An object of the present invention is to solve erosion and dishing problems caused in a conventional polishing process, in which a silicon nitride layer is polished until a polysilicon layer is exposed.

To achieve the object, an embodiment of the present invention provides a polishing method, including: providing a semiconductor substrate including a polysilicon layer and a silicon nitride layer, wherein the polysilicon layer is covered by the silicon nitride layer; and polishing the silicon nitride layer on a fixed abrasive pad until the polysilicon layer is exposed, wherein a polishing slurry used in the polishing process is featured with a PH value ranging from 10.5 to 11 and including an anionic surfactant or a zwitterionic surfactant.

Optionally, the zwitterionic surfactant includes proline.

Optionally, an abrasive on the fixed abrasive pad includes cerium dioxide.

Optionally, a polishing process performed to polish the silicon nitride layer is featured with a pressure intensity ranging from 1 to 2 psi and a rotational speed of polishing platen ranging from 10 to 25 rpm.

Optionally, the endpoint detection method used in the polishing process is a motor current endpoint detection method or an optics endpoint detection method.

Moreover, the present invention provides a method for forming a gate that includes forming a dummy gate structure on a semiconductor substrate, wherein the dummy gate includes a sacrificial oxide layer and a polysilicon layer covering the sacrificial oxide layer, forming spacers around the dummy gate, forming a silicon nitride layer and a dielectric layer successively, wherein the silicon nitride layer covers the polysilicon layer and the spacers and the substrate and the dielectric layer covers the silicon nitride layer. The method further includes polishing the dielectric layer until the silicon nitride layer is exposed, and polishing the silicon nitride layer on a fixed abrasive pad until the polysilicon layer is exposed, wherein a polishing slurry used in this polishing process is featured with a PH value ranging from 10.5 to 11 and including an anionic surfactant or a zwitterionic surfactant. The method additionally includes forming an opening after removing the dummy gate, and forming a gate in the opening.

Optionally, the zwitterionic surfactant includes proline.

Optionally, an abrasive on the fixed abrasive pad includes cerium dioxide.

Optionally, a polishing process performed to polish the silicon nitride layer is featured with an intensity of pressure ranging from 1 to 2 psi and a rotational speed of polishing platen ranging from 10 to 25 rpm.

Optionally, the dielectric layer is polished on a fixed abrasive pad or an unfixed abrasive pad until the silicon nitride layer is exposed.

Compared with the prior art, the present invention has the following advantages: In a polishing process, in which a silicon nitride layer is polished on a fixed abrasive pad until a polysilicon layer is exposed, a better removal selectivity ratio can be achieved by arranging an appropriate polishing environment such as adding an anionic surfactant or a zwitterionic surfactant to a polishing slurry which has a PH value ranging from 10.5 to 11, so that the erosion and dishing problems caused by the prior art can be improved in the polishing process in which a silicon nitride layer is polished on a fixed abrasive pad until a polysilicon layer is exposed.

In addition, product yield also can be increased through applying the polishing method described above to the polishing process in which a silicon nitride layer is polished until a polysilicon layer is exposed for forming a high-k dielectric metal gate.

DETAILED DESCRIPTION OF THE INVENTION

In the prior art, erosion and dishing problems caused by a polishing process in which a silicon nitride layer is polished on a fixed abrasive polishing pad until a polysilicon layer is exposed lead to poor polishing results. Embodiments of the present invention not only can achieve a better removal selectivity ratio for polishing of a silicon nitride layer and a polysilicon layer by arranging an appropriate polishing environment, such as adding an anionic surfactant or a zwitterionic surfactant to a polishing slurry which is featured with a PH value ranging from 10.5 to 11, but also can improve erosion and dishing problems caused in the prior art in the polishing process in which a silicon nitride layer is polished on a fixed abrasive polishing pad until a polysilicon layer is exposed.

The above-mentioned and other objectives, features and advantages of the present invention will become clearer through the description with accompanying drawings.

Although the present invention is disclosed hereinafter with reference to preferred embodiments, it also can be implemented in other embodiments and those skilled in the art may modify and vary the embodiments without departing from the spirit and scope of the present invention. Therefore, the present invention is not limited by the embodiments disclosed herein.

Figure 7:
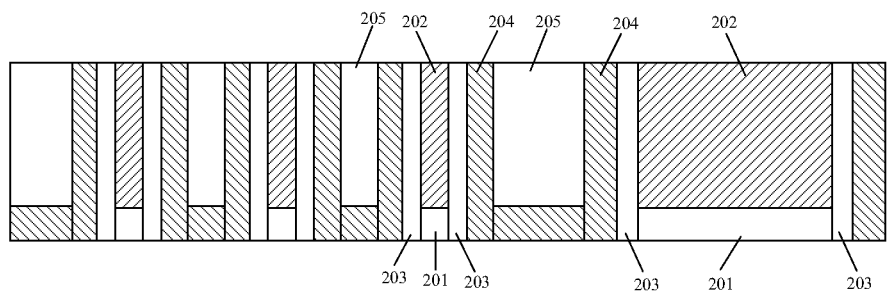
FIG. 7 to FIG. 9 are schematic cross-sectional views of ideal patterns with different sizes after polishing of a silicon nitride layer in a method for forming a high-k dielectric metal gate.
Figure 8:
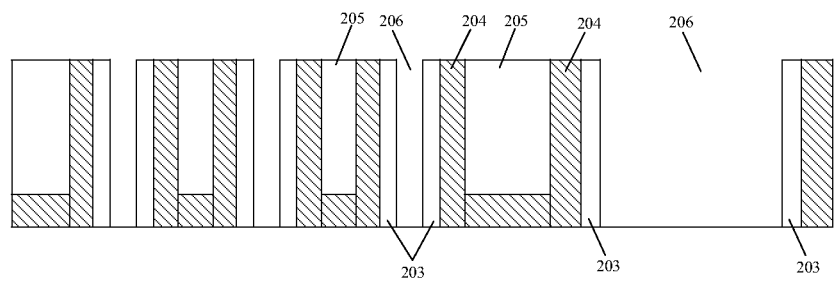
Figure 9:
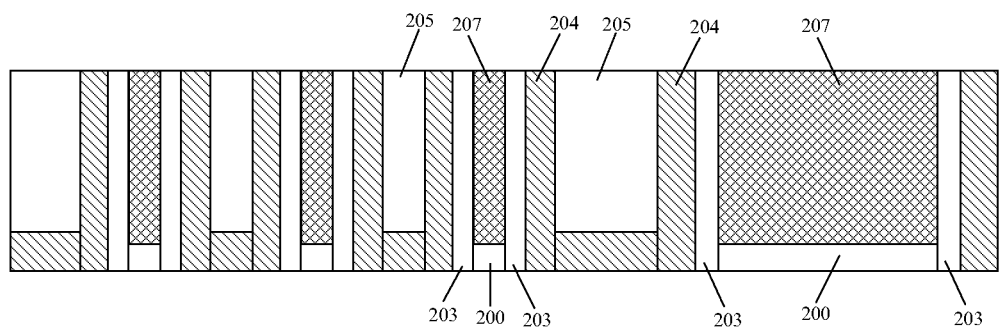

FIG. 7 to FIG. 9 are schematic cross-sectional views of ideal patterns with different sizes after polishing of a silicon nitride layer in a method for forming a high-k dielectric metal gate. A gate structure formed generally has various patterns with different sizes. Referring to FIG. 7, ideally, a surface of the gate structure should have a high flatness and uniformity after a polishing process in which a silicon nitride layer 204 and a dielectric layer 205 are polished until a polysilicon layer 202 is exposed. And referring to FIG. 8 and FIG. 9, in subsequent steps, an opening 206 is formed after the polysilicon layer 202 and a sacrificial oxide layer 201 are removed, and a gate dielectric layer 200 and a metal gate 207 are formed successively in the opening 206. Herein, the gate dielectric layer 200 may include high-k materials, and the metal gate 207 may include aluminum or ruthenium.

Figure 10:
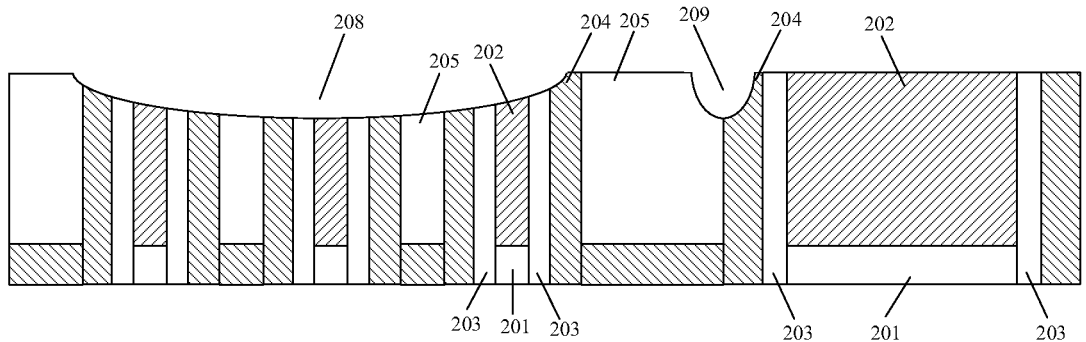
FIG. 10 to FIG. 12 are schematic cross-sectional views of defective patterns with different sizes after polishing of a silicon nitride layer in a method for forming a high-k dielectric metal gate.
Figure 11:
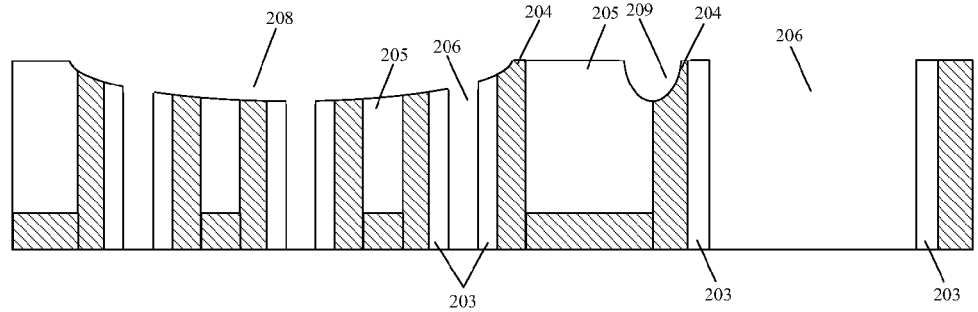
Figure 12:
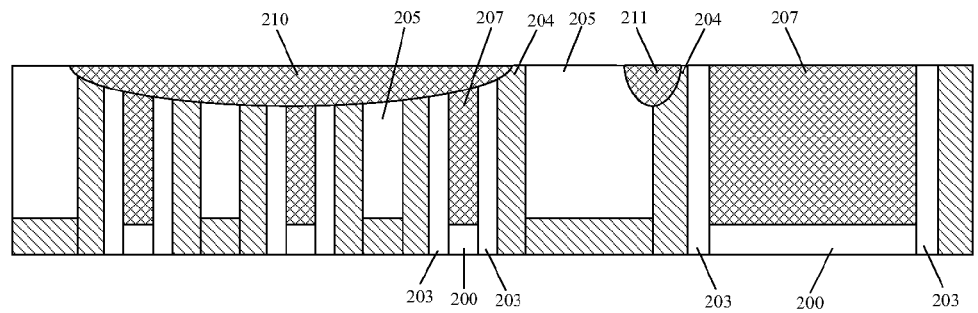

However, as described above, erosion and dishing problems are caused by the polishing process in which a silicon nitride layer is polished on a fixed abrasive polishing pad until a polysilicon layer is exposed. For example, FIG. 10 to FIG. 12 are schematic cross-sectional views of defective patterns with different sizes after polishing of a silicon nitride layer in a method for forming a high-k dielectric metal gate. Referring to FIG. 10, in pattern-intensive areas, an opening 208 is formed during the polishing process because of an erosion which may be 100 to 200 angstroms; while in dielectric layer areas with larger sizes, an opening 209 is formed during the polishing process because of a dishing which may be 200 to 300 angstroms. Referring to FIG. 11 and FIG. 12, in subsequent steps, firstly an opening 206 is formed after the polysilicon layer 202 and the sacrificial oxide layer 201 are removed. After that, a gate dielectric layer 200 and a metal gate 207 are formed successively in the opening 206. Then, in the metal gate formation process, the opening 208 and the opening 209 are filled up to form a metal layer 210 and a metal layer 211 respectively, which may cause bridging, thereby leading to device failure and reducing product yield. In addition, the reasons for the erosion and dishing problems will be described in detail below.

An embodiment of the present invention provides a polishing method to solve the problems described above by changing the conditions or environment of the polishing process. The polishing method includes providing a semiconductor substrate on which a polysilicon layer and a silicon nitride layer are formed, wherein the polysilicon layer is covered by the silicon nitride layer; polishing the silicon nitride layer on a fixed abrasive pad until the polysilicon layer is exposed, wherein a polishing slurry used in the polishing method is featured with a PH value ranging from 10.5 to 11 and including an anionic surfactant or a zwitterionic surfactant.

Figure 1:
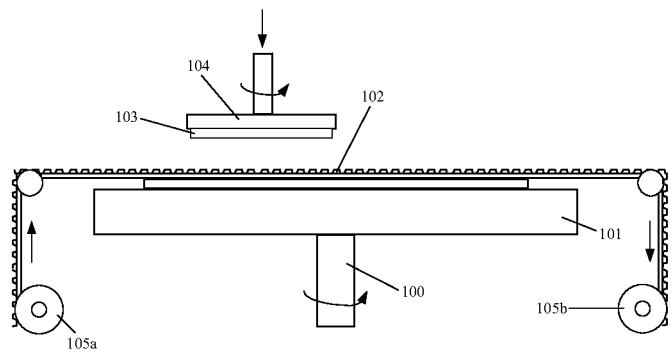
FIG. 1 is a schematic cross-sectional view of a polishing device used in a fixed abrasive polishing method, as known in the prior art.
Figure 2:
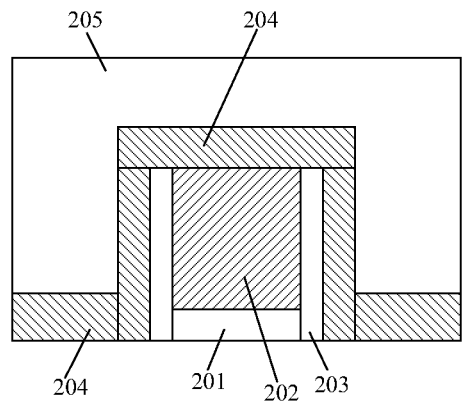
FIG. 2 to FIG. 6 are schematic cross-sectional views of intermediate structures illustrating a method for forming a high-k dielectric metal gate, as known in the prior art.
Figure 3:
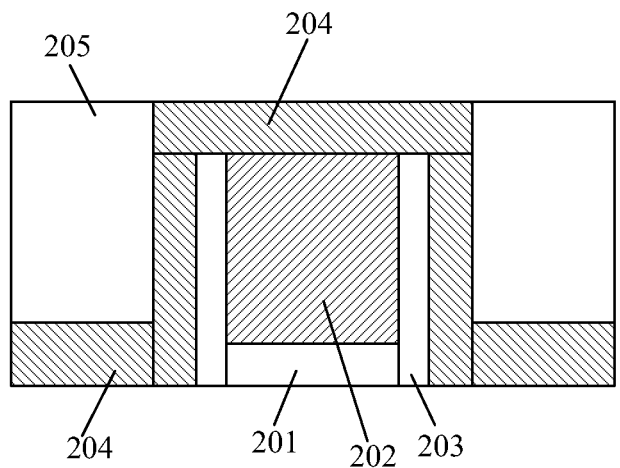
Figure 4:
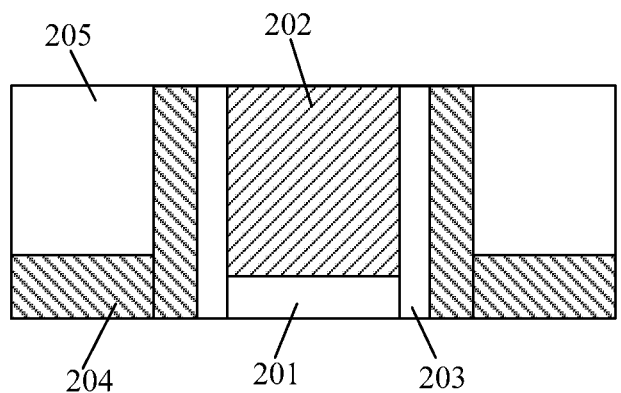
Figure 5:
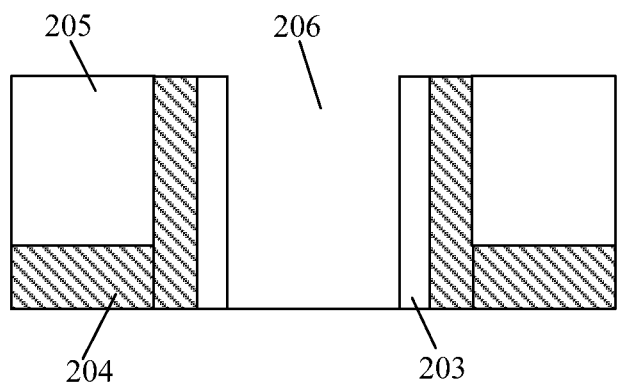
Figure 6:
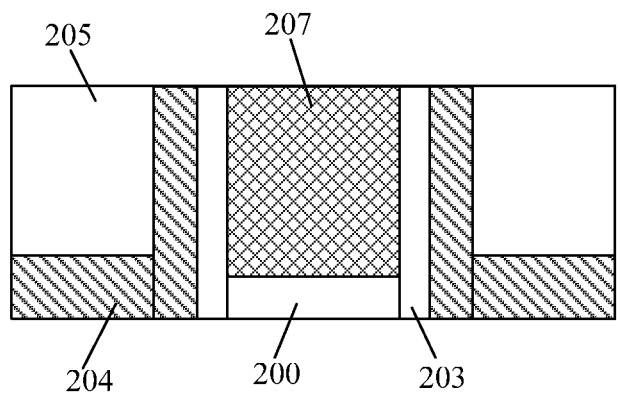

With taking the method for forming a high-k dielectric metal gate as an exemplary embodiment, the difference between the embodiment and the prior art is illustrated as below. Referring to FIG. 3, in the polishing process in which the silicon nitride layer 204 and the dielectric layer 205 are polished until the polysilicon layer 202 is exposed, a wafer is mounted on a fixed abrasive polishing pad. The wafer is polished by a polishing slurry which is featured with a PH value ranging from 10.5 to 11 (this value may be set by a titration) and including a surfactant. In an embodiment, the surfactant may include proline, an abrasive used on the fixed abrasive pad may include cerium oxide, an intensity of pressure forced by the polishing head on the wafer ranges from 1 to 2 psi, a rotational speed of the polishing platen ranges from 10 to 25 rpm, and an endpoint detection method may include a motor current endpoint detection method or an optics endpoint detection method.

Moreover, in this embodiment, a polishing process in which a dielectric layer is polished until a silicon nitride layer is exposed is performed on a fixed abrasive polishing pad. In other embodiments, it also can be performed on an unfixed abrasive polishing pad. Optionally, an abrasive in the polishing slurry may include cerium dioxide.

The reasons that cause erosion and dishing problems in the polishing process in which a silicon nitride layer is polished until a polysilicon layer is exposed and polishing principles of using a polishing slurry which is featured with a PH value ranging from 10.5 to 11 and including a surfactant will be explained in detail as follows.

Figure 13:
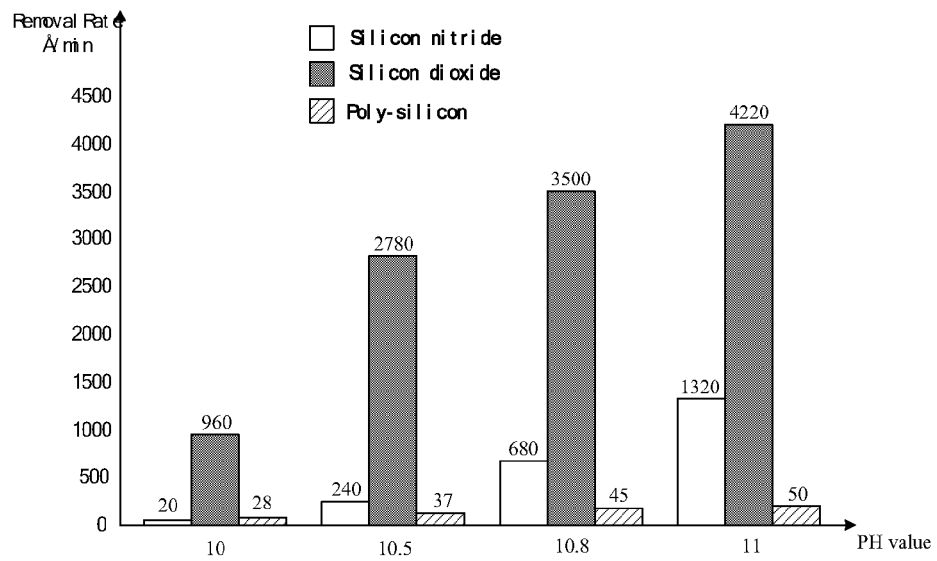
FIG. 13 is a schematic diagram showing removal ratio changes of silicon nitride, silicon dioxide, and polysilicon in mediators with different PH values.

FIG. 13 is a schematic view of removal ratio changes of silicon nitride, silicon dioxide, and polysilicon in mediators with different PH values. After careful study, the inventors have discovered that the removal rates of silicon nitride, silicon dioxide, and polysilicon change greatly in mediators (in this embodiment, the mediator is a polishing slurry including proline) with different PH values. Referring to FIG. 13, when the PH value of the polishing slurry is 10, the removal rate of silicon dioxide is about 960 Å/min, the removal rate of silicon nitride is about 20 Å/min, and the removal rate of polysilicon is about 28 Å/min. In the prior art, a polishing slurry having a PH value ranging from 10 to 10.3 is generally used in those polishing processes on a fixed abrasive polishing pad. Within this PH value range, the removal rate of silicon dioxide is much greater than the removal rate of silicon nitride and the removal rate of polysilicon. In other words, the removal rate has a greater selectivity to silicon dioxide and silicon nitride. In conclusion, by using the fixed abrasive polishing method, a good polishing result may be achieved in a polishing process in which an oxide layer is polished until a silicon nitride layer is exposed when the PH value of a polishing slurry used in this process ranges from 10 to 10.3. For example, in a shallow trench isolation process, the fixed abrasive polishing method is generally used. But when the PH value ranges from 10 to 10.3, the removal rate of silicon nitride is so close to the removal rate of polysilicon that the removal rate has very a small selectivity to these two kinds of materials. Therefore, this method can't be adopted to polish a silicon nitride layer in a process for forming a high-k dielectric metal gate.

However, when the PH value of a polishing slurry ranges from 10.5 to 11, referring to 13, with the increase of the PH value, the removal rates of silicon nitride, silicon dioxide, and polysilicon increase in different degrees. Specifically, when the PH value increases from 10.5 to 11, the removal rate of silicon nitride increases from 240 Å/min to 1320 Å/min, while the removal rate of polysilicon is not over 50 Å/min. In conclusion, the removal rate has a greater selectivity to silicon nitride and polysilicon. Based on this result, by using the fixed abrasive method, a good polishing result may be achieved in the polishing process in which a silicon nitride layer is polished until a polysilicon layer is exposed with a polishing slurry which is featured with a PH value ranging from 10.5 to 11. Therefore, the fixed abrasive method is suitable to be applied to polish a silicon nitride layer until a polysilicon layer is exposed in the process for forming a high-k dielectric metal gate.

Hereafter, the principles of the removal rate changes of silicon nitride, silicon dioxide, and polysilicon in different mediators with different PH values are illustrated in detail. Isoelectric point is a PH value of a solution which is featured with zero net charge and including both positive ions and negative ions. Total charge of the solution depends on the PH value of the solution because zwitter-ions in this solution may release or absorb protons (such as, H+) at different PH values. When the PH value is equal to the isoelectric point, the number of positive ions is equal to the number of negative ions in the solution and a fixed layer with net charge is formed on the surface of the zwitter-ions, so that the zwitter-ions in this solution have zero charge. And if electric ions on the surface of the zwitter-ions are H+/OH−, the surface charge of the zwitter-ions is determined by the PH value of the solution where these zwitter-ions dissolve in. In other words, isoelectric point is also a PH value of a solution when the surface charge of the zwitter-ions which dissolve in the solution is zero. Therefore, the electric charge of the zwitter-ions may change according to different PH values of the solution. Specifically, the zwitter-ions in the solution have zero charge because in this solution the number of the positive ions is equal to the number of the negative ions when the PH value of this solution is equal to the isoelectric point, the zwitter-ions in this solution have negative charge when the PH value of the solution is more than the isoelectric point, and the zwitter-ions have positive electric charge when the PH value of the solution is less than the isoelectric point.

TABLE 1 isoelectric points and electric charge changes of different materials at different PH values

| Material Type | Iso-electric Point | PH = 10 | PH = 10.5 | PH = 10.8 | PH = 11 |
|---|---|---|---|---|---|
| silicon nitride | 5.0 | NN | NN | NN | NNN |
| polysilicon | 10.8 | P | P | P | N |
| cerium dioxide | 10.2 | P | 0 | N | NN |
| Silicon dioxide | 2.2 | NNN | NNN | NNN | NNNN |

Table. 1 shows isoelectric points and electric charge changes of different materials at different PH values. P indicates positive potential, N indicates negative potential, and 0 indicates zero potential. Moreover, the number of N indicates scale of negative potential, for example, 'NNNN' indicates greater negative potential than 'N'.

In an embodiment of the present invention, the polishing slurry includes proline (R—NH+2-CH2CH2COO—) which is a zwitterionic surfactant with a positive charge group and a negative charge group, wherein proline is an anionic surfactant when it is in an alkaline solution and proline is a cationic surfactant when it is in an acidic solution. Therefore, when the PH value ranges from 10 to 11, proline (IEP=6) is an anionic surfactant which can be absorbed on the surface of polishing materials in different degrees. In other embodiments, anionic surfactants or any other zwitterionic surfactants may also be adopted.

Figure 14:
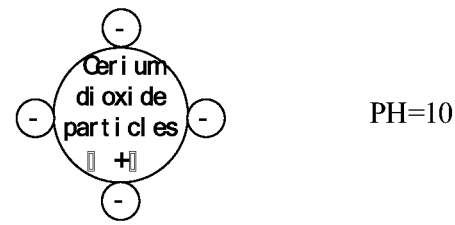
FIG. 14 to FIG. 17 are schematic views showing ionic absorption quantity of a silicon nitride layer, an oxide layer, a polysilicon layer, and cerium oxide particles in mediators with different PH values.
Figure 14:
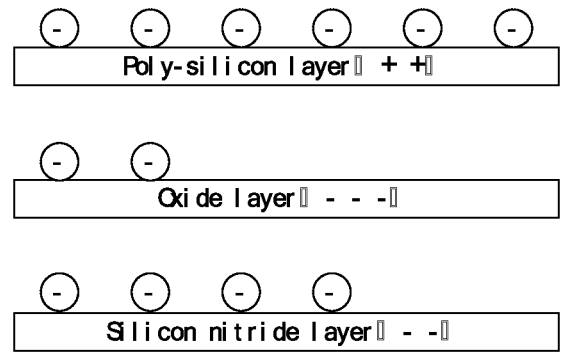

FIG. 14 to FIG. 17 are schematic views showing ionic absorption quantity of a silicon nitride layer, an oxide layer, a polysilicon layer, and cerium oxide particles in different mediators with different PH values. Referring to FIG. 14, when the PH value of a polishing slurry is 10, according to table 1, because the cerium dioxide particles dissociating from a fixed abrasive polishing pad and the a polysilicon layer both have positive potential ('+' and '++' indicate scale of positive potential of the cerium dioxide particles and the polysilicon layer respectively in the drawings), much anionic surfactant may be absorbed, whereby a protection layer is formed on the surface. The protection layer may degrade polishing efficiency and reduce the removal rate of the polysilicon layer. Moreover, a silicon nitride layer has a smaller negative potential ('--' indicates scale of negative potential) and also can absorb enough anionic surfactant, so that the removal rate of silicon nitride layer is as low as the removal rate of polysilicon. Comparatively, negative potential ('---' indicates scale of negative potential in the drawings) of an oxide layer (silicon dioxide) is much greater and anionic surfactant absorbed by the oxide layer is much less, so that the polishing removal rate of the oxide layer is greater. Referring to FIG. 13, when the PH value is 10, the removal rate of the silicon nitride layer and the polysilicon layer are less than 50 Å/min, and the removal rate of the oxide layer is approximately close to 1000 Å/min. Therefore, this PH value is suitable to polish an oxide layer until a silicon nitride is exposed.

Figure 15:
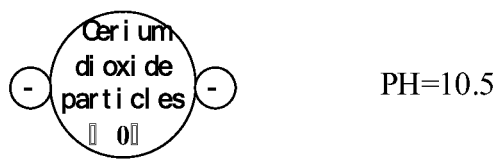
Figure 15:
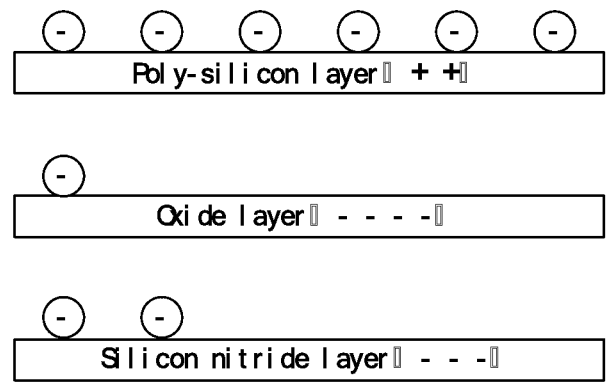

Referring to FIG. 15, according to table 1, when the PH value is 10.5, the potential of cerium dioxide particles is approximately zero (0 indicates it in drawings). The quantity of anionic surfactant absorbed by the cerium dioxide particles is much less than that was when the PH value was 10. But the quantity of anionic surfactant absorbed by the polysilicon layer is still great because the polysilicon layer has positive potential ('++' indicates it in drawings). Although the quantity of anionic surfactant absorbed by the cerium dioxide particles is reduced, the influence on polishing of the polysilicon layer is still small and the removal rate of polysilicon is still low. And the quantity of anionic surfactant absorbed by the silicon nitride layer is obviously reduced because the negative potential ('---' indicates it in drawings) of the silicon nitride layer further increases and the quantity of anionic surfactant absorbed by the cerium oxide particles is also reduced, which induces the removal rate of the silicon nitride layer increasing obviously. Moreover, the negative potential ('----' indicates it in drawings) of the oxide layer also increases and the quantity of anionic surfactant of absorbed by the oxide layer is little, so that the removal rate of the silicon oxide layer increases further. Referring to FIG. 13, when the PH value is 10.5, the removal rate of the polysilicon layer is still less than 50 Å/min, the removal rate of the silicon nitride layer increases up to approximately 240 Å/min, and the removal rate of the oxide layer increases up to approximately 2780 Å/min. So this PH value starts to be suitable to polishing a silicon nitride layer until a polysilicon layer is exposed.

Figure 16:
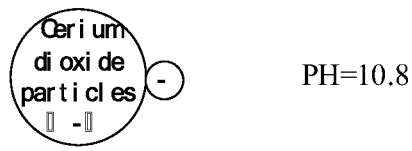
Figure 16:
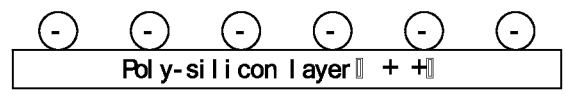

Referring to FIG. 16, according table 1, when the PH value is 10.8, the potential ('-' indicates it in drawings) of the cerium oxide particles is negative. The quantity of anionic surfactant absorbed by the cerium oxide particles is much less than that is the case where the PH value was 10.5. And the polysilicon layer surface still can absorb much anionic surfactant because the polysilicon layer still has positive potential ('++' indicates it in drawings), but the influence on polishing of the polysilicon layer is still small and the removal rate of polysilicon is still low. And the quantity of anionic surfactant absorbed by the silicon nitride layer is little because the negative potential ('----' indicates it in drawings) of the silicon nitride layer further increases and the quantity of anionic surfactant absorbed by the cerium dioxide particles becomes little, which make the removal rate of the silicon nitride layer further increase. Moreover, the oxide layer can't absorb anionic surfactant any more when the negative potential on the surface of the oxide layer keeps increasing, so that the removal rate of the oxide layer keep increasing. Referring to FIG. 13, when the PH value is 10.8, the removal rate of the polysilicon layer is less than 50 Å/min, the removal rate of the silicon nitride layer increases up to approximately 680 Å/min, and the removal rate of the oxide layer increases up to approximately 3500 Å/min. So this PH is also suitable to polishing a silicon nitride layer until a polysilicon layer is exposed.

Figure 17:
Figure 18:
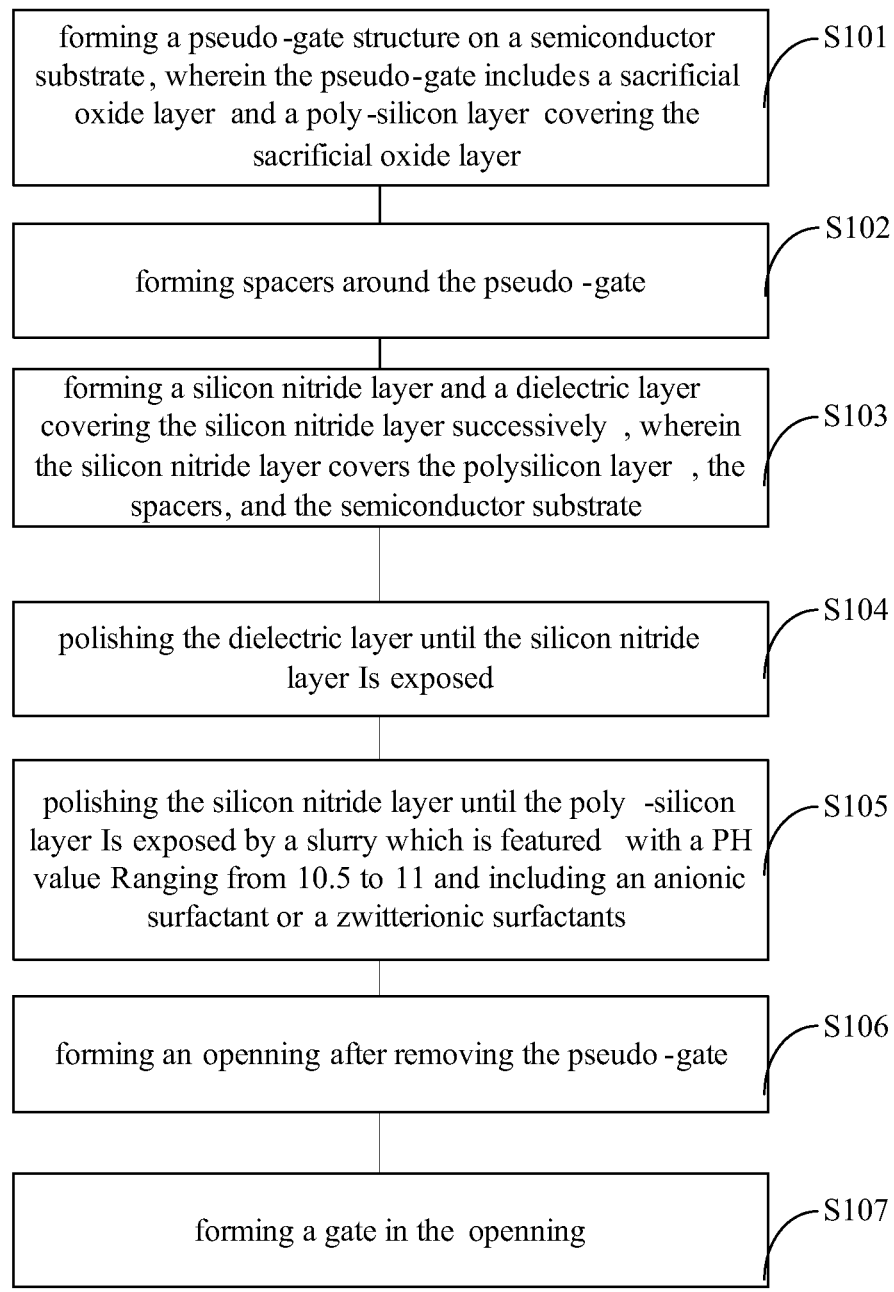
FIG. 18 is a flow chart of a method for forming a gate according to an embodiment of the present invention.

Referring to FIG. 17, according table 1, when PH value is 11, the negative potential ('--' indicates it in drawings) of cerium dioxide particles further increases, so that it can't absorb anionic surfactant any more. And although the polysilicon layer has negative potential ('-' indicates it in drawings) on its surface and the quantity of anionic surfactant absorbed by the polysilicon layer is reduced, the influence on polishing of the polysilicon layer is still small and the removal rate of polysilicon is still low. And a silicon nitride layer can't absorb anionic surfactant any more because the negative potential ('-----' indicates it in drawings) of the silicon nitride layer further increases and the cerium oxide particles also can't absorb anionic surfactant any more, which make the removal rate of the silicon nitride layer further increase. Moreover, the oxide layer also can't absorb anionic surfactant when the negative potential ('------' indicates it in drawings) on surface of the oxide layer keeps increasing, so that the removal rate of the oxide layer keep increasing. Referring to FIG. 13, when the PH value is 11, the removal rate of the polysilicon layer is less than 50 Å/min, the removal rate of the silicon nitride layer increases up to approximately 1320 Å/min, and the removal rate of the oxide layer increases up to approximately 4220 Å/min. So this PH value is also suitable to polishing a silicon nitride layer until a polysilicon layer is exposed.

It should be noted that, in an embodiment of the present invention, the abrasive on the fixed abrasive pad includes cerium dioxide, but other kinds of abrasive whose isoelectric point are equal or close to the isoelectric point of cerium dioxide may also be used.

In conclusion, when the PH value ranges from 10.5 to 11, the removal rate of the polysilicon layer is never more than 50 Å/min, while the removal rate of the silicon nitride layer increases up to about 200 Å/min to 1400 Å/min. In other words, the removal rate has a great selectivity to silicon nitride and polysilicon in this polishing environment. Therefore, the fixed abrasive method is suitable for polishing a silicon nitride layer until a polysilicon layer is exposed in the process for forming a high-k dielectric metal gate, through which a higher flatness and uniformity can be achieved.

Based on the polishing method mentioned above, a method for forming a gate is also provided in the embodiment of the present invention. According to FIGS. 2 to 6 and FIG. 18 which is a flow chart illustrating steps of a method for forming a gate according to an embodiment of the present invention, the method for forming a gate includes:

Step S101, forming a dummy gate (shown as "pseudo-gate" in FIG. 18) on a semiconductor substrate, wherein the dummy gate includes a sacrificial oxide layer 201 and a polysilicon layer 202 covering the sacrificial oxide layer 201;

Step S102, forming spacers 203 around the dummy gate, wherein the spacers 203 include silicon dioxide;

Step S103, forming a silicon nitride layer 204 and a dielectric layer 205 covering the silicon nitride layer 204 in sequence, wherein the silicon nitride layer 204 covers the polysilicon layer 202, the spacers 203 and the substrate, and the dielectric layer 205 includes silicon dioxide;

Step S104, polishing the dielectric layer 205 until the silicon nitride layer 204 is exposed;

Step S105, polishing the silicon nitride layer 204 on a fixed abrasive pad until the polysilicon layer 202 is exposed, wherein a polishing slurry used in the polishing process is featured with a PH value ranging from 10.5 to 11 and including an anionic surfactant or a zwitterionic surfactant;

Step S106, forming an opening 206 after removing the dummy gate. Specifically, the opening 206 is formed by etching the sacrificial oxide layer 201 and the polysilicon layer 202; and Step S107, forming a gate in the opening 206, wherein the gate includes a dielectric layer 200 and a metal gate 207 covering the gate dielectric layer 200, the gate dielectric layer 200 includes high-k materials, and the metal gate 207 includes aluminum.

It should be noted that, the method for forming a high-k dielectric metal gate is disclosed as an example embodiment, rather than limiting the scope of the present invention. The polishing method disclosed above is also applicable to other embodiments which need a polishing process in which a silicon nitride layer is polished until a polysilicon layer is exposed.

In summary, the polishing method and the method for forming a gate provided by the embodiment of the present invention have the following advantages: In the polishing process in which a silicon nitride layer is polished on a fixed abrasive pad until a polysilicon layer is exposed, a better removal selectivity can be achieved by arranging an appropriate polishing environment, such as adding an anionic surfactant or a zwitterionic surfactant to a polishing slurry which is featured with a PH value ranging from 10.5 to 11, so that the erosion and dishing problems caused in the prior art can be improved in the process of polishing a silicon nitride layer until a polysilicon layer is exposed.

Moreover, product yield is also improved through applying this method to the process for forming a high-k dielectric metal gate in the polishing process in which a silicon nitride layer is polished until a polysilicon layer is exposed.

Although the present invention has been disclosed as above with reference to preferred embodiments, it is not intended to limit the present invention. Those skilled in the art may modify and vary the embodiments without departing from the spirit and scope of the present invention. Accordingly, the scope of the present invention shall be defined in the appended claims.

What is claimed is:

1. A polishing method comprising:
   providing a semiconductor substrate, wherein the semiconductor substrate includes a polysilicon layer, a silicon nitride layer overlying the polysilicon layer, and a dielectric layer overlying the silicon nitride layer;
   polishing the dielectric layer until the silicon nitride layer is exposed; and
   polishing the silicon nitride layer by a fixed abrasive pad having an abrasive thereon until the polysilicon layer is exposed, wherein a polishing slurry used in the polishing process is featured with a PH value ranging from 10.5 to 11, and comprising an anionic surfactant or a zwitterionic surfactant, wherein the dielectric layer comprising silicon dioxide is polished using the polishing slurry, and wherein a removal rate of the polysilicon layer by the polishing slurry is less than about 50 Å/min.

2. The polishing method according to claim 1, wherein the zwitterionic surfactant comprises proline.

3. The polishing method according to claim 1, wherein abrasive on the fixed abrasive pad comprises cerium oxide.

4. The polishing method according to claim 1, wherein the polishing the silicon nitride layer comprises a pressure having an intensity ranging from 1 to 2 psi and a rotational speed of a polishing platen ranging from 10 to 25 rpm.

5. The polishing method according to claim 1, wherein the polishing comprises an endpoint detection method.

6. The polishing method according to claim 5, wherein the endpoint detection method comprises a motor current endpoint detection or an optics endpoint detection.

7. A method for forming a gate, the method comprising:
   forming a dummy gate on a semiconductor substrate, wherein the dummy gate comprises a sacrificial oxide layer and a polysilicon layer overlying the sacrificial oxide layer;
   forming spacers around the dummy gate;
   successively forming a silicon nitride layer and a dielectric layer overlying the silicon nitride layer, wherein the silicon nitride layer covers the polysilicon layer, the spacers, and the semiconductor substrate;
   polishing the dielectric layer until the silicon nitride layer is exposed;
   polishing the silicon nitride layer by a fixed abrasive pad until the polysilicon layer is exposed, wherein a polishing slurry used in the polishing process is featured with a PH value ranging from 10.5 to 11 and comprising an anionic surfactant or a zwitterionic surfactant, wherein the dielectric layer comprising silicon dioxide is polished using the polishing slurry, and wherein a removal rate of the polysilicon layer by the polishing slurry is less than about 50 Å/min;
   forming an opening after removing the dummy gate; and
   forming a gate in the opening.

8. The method for forming a gate according to claim 7, wherein the zwitterionic surfactant comprises proline.

9. The method for forming a gate according to claim 7, wherein the fixed abrasive pad comprises an abrasive including cerium oxide.

10. The method for forming a gate according to claim 7, wherein the polishing the silicon nitride layer comprises a pressure intensity ranging from 1 to 2 psi and a rotational speed of a polishing platen ranging from 10 to 25 rpm.

11. The method for forming a gate according to claim 7, wherein polishing the dielectric layer comprises a fixed abrasive pad or an unfixed abrasive pad.

\* \* \* \* \*